United States Patent
Wakayama

(10) Patent No.: US 6,836,522 B1
(45) Date of Patent: Dec. 28, 2004

(54) CLOCK SIGNAL EXTRACTING CIRCUIT, PARALLEL DIGITAL INTERFACE INCLUDING CLOCK SIGNAL EXTRACTING CIRCUIT, CLOCK SIGNAL EXTRACTING METHOD AND PARALLEL DATA BIT SIGNAL SYNCHRONIZING METHOD USING CLOCK SIGNAL EXTRACTING METHOD

(75) Inventor: Yasushi Wakayama, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 833 days.

(21) Appl. No.: 09/689,528

(22) Filed: Oct. 12, 2000

(30) Foreign Application Priority Data

Oct. 14, 1999 (JP) .............................................. 11292702

(51) Int. Cl.[7] .................................................. H03D 3/24
(52) U.S. Cl. ...................... 375/376; 375/371; 375/362; 375/354
(58) Field of Search ................................ 375/373–374, 375/376, 371, 362, 355, 354

(56) References Cited

U.S. PATENT DOCUMENTS

| | | | | |
|---|---|---|---|---|
| 5,732,336 | A | * | 3/1998 | Tochihara .................... 455/136 |
| 6,169,774 | B1 | * | 1/2001 | Yamada ....................... 375/375 |
| 6,236,696 | B1 | * | 5/2001 | Aoki et al. .................. 375/376 |
| 6,285,726 | B1 | * | 9/2001 | Gaudet ........................ 375/376 |

FOREIGN PATENT DOCUMENTS

| | | |
|---|---|---|
| JP | 62-136143 | 6/1987 |
| JP | 62-257238 | 11/1987 |
| JP | 62-278836 | 12/1987 |
| JP | 3-145351 | 6/1991 |
| JP | 6-54016 | 2/1994 |

* cited by examiner

Primary Examiner—Mohammad H. Ghayour
Assistant Examiner—Pankaj Kumar
(74) Attorney, Agent, or Firm—Scully, Scott, Murphy & Presser

(57) ABSTRACT

A clock signal extracting circuit extracting a clock signal from N-pieces of data bit signals, where said N is an integer of two or more, including N-pieces of phase comparators, each of which compares a phase of each of the data bit signals with a phase of an extracted clock signal and generates a up-signal and a down-signal in accordance with a compared result, N-pieces of charge pumps, each of which generates a current in accordance with the up-signal and the down-signal inputted from each phase comparator, an adder for adding currents generated by the N-pieces of charge pumps, a loop filter for generating a control voltage in accordance with an added current by the adder, and a voltage control oscillator for generating the extracted clock signal of a frequency in accordance with control voltage. With this configuration, it is possible to prevent a retiming margin in a parallel digital interface from increasing.

8 Claims, 9 Drawing Sheets

CLOCK SIGNAL EXTRACTING CIRCUIT, PARALLEL DIGITAL INTERFACE INCLUDING CLOCK SIGNAL EXTRACTING CIRCUIT, CLOCK SIGNAL EXTRACTING METHOD AND PARALLEL DATA BIT SIGNAL SYNCHRONIZING METHOD USING CLOCK SIGNAL EXTRACTING METHOD

BACKGROUND OF THE INVENTION

1. Field of the Invention

The present invention relates to a clock signal extracting circuit and more particularly to the clock signal extracting circuit used for a parallel digital interface. As the parallel digital interface, there are an interface between LSI (Large Scale Integrated) circuits on a same substrate, an interface between substrates, an interface between apparatuses and a like.

2. Description of the Related Art

In a parallel digital interface, a clock signal synchronizing operation is applied to plural inputted bit signals in order to compensate a skew caused by a delay difference in a transmission line. A clock signal extracting circuit for generating a clock signal used for this synchronizing operation, as shown in FIG. 9, generally selects a bit signal among plural inputted bit signals and extracts a clock signal based on a selected clock signal.

That is, as shown in FIG. 9, the clock signal extracting circuit includes a phase comparator 902, a charge pump 903, a loop filter 904 and a voltage control oscillator 905 and generates a clock signal 909 based on, for example, an N-th data bit signal 908-N inputted from a N-th data bit signal terminal 901-N among data bit signals inputted from a first data bit signal input terminal 901-1 through the N-th data bit signal input terminal 901-N.

A D-type flip-flop circuit 906-1 through a D-type flip-flop circuit 906-N synchronize an input signal 908-1 through the input signal 908-N by the clock signal 909 and output synchronized signals to a data bit signal output terminal 907-1 through an N-th data bit signal output terminal 907-N. Signals outputted from a first data bit signal output terminal 907-1 through an N-th data bit signal output terminal 907-N are inputted into a rear-stage system.

As shown in FIG. 10, when a clock signal is extracted from only the third data bit signal 908-3 by the clock signal extracting circuit shown in FIG. 9, as indicated by a waveform 405, the extracting clock signal rises at a middle point T21 between adjacent change points of the third data bit signal 908-3. In this extracting clock signal, for example, when retiming is applied to the data bit signal 908-1, a delay of the data bit signal 908-1 displaces largely as to the third data bit signal 908-3, therefore, a time margin of this retiming becomes small.

Therefore, in the parallel digital interface using the conventional signal extracting circuit, there is a problem in that a retiming margin decreases when skews exist among plural bits. Recently, since signals are transmitted via the parallel digital interface at higher and higher speed, it is required that the retiming margin is prevented from decreasing in the parallel digital interface.

SUMMARY OF THE INVENTION

In view of the above, it is an object of the present invention to provide a clock signal extracting circuit capable of preventing a retiming margin from decreasing in a parallel digital interface.

According to a first aspect of the present invention there is provided a clock signal extracting circuit for extracting a clock signal from N-pieces of data bit signals, where the N is an integer of two or more, the clock signal extracting circuit including:
  N-pieces of phase comparators, each of which compares a phase of each of the data bit signals with a phase of an extracted clock signal and generates a phase difference signal in accordance with a compared result;
  a circuit for averaging N-pieces of the phase difference signals and for generating a control voltage; and
  a voltage control oscillator for generating the extracted clock signal of a frequency in accordance with the control voltage.

According to a second aspect of the present invention there is provided a clock signal extracting circuit for extracting a clock signal from N-pieces of data bit signals, where the N is an integer of two or more, the clock signal extracting circuit including:
  N-pieces of phase comparators, each of which compares a phase of each of the data bit signals with a phase of an extracted clock signal and generates a phase difference signal in accordance with a compared result;
  a circuit for generating a control voltage based on a phase difference signal indicating a maximum phase difference and a phase difference signal indicating a minimum phase difference among N-pieces of the phase difference signals; and
  a voltage control oscillator for generating the extracted clock signal of a frequency in accordance with the control voltage.

According to a third aspect of the present invention there is provided a clock signal extracting circuit extracting a clock signal from N-pieces of data bit signals, where the N is an integer of two or more, the clock signal extracting circuit including:
  N-pieces of phase comparators, each of which compares a phase of each of the data bit signals with a phase of an extracted clock signal and generates a up-signal and a down-signal in accordance with a compared result;
  N-pieces of charge pumps, each of which generates a current in accordance with the up-signal and the down-signal inputted from each of the phase comparators;
  an adder for adding the currents generated by the N-pieces of charge pumps;
  a loop filter for generating a control voltage in accordance with an added current by the adder; and
  a voltage control oscillator for generating the extracted clock signal of a frequency in accordance with the control voltage.

According to a fourth aspect of the present invention there is provided a clock signal extracting circuit extracting a clock signal from N-pieces of data bit signals, where the N is an integer of two or more, the clock signal extracting circuit including:
  N-pieces of phase comparators, each of which compares a phase of each of the data bit signals with a phase of an extracted clock signal and generates an up-signal and a down-signal in accordance with a compared result;
  a maximum up-signal selecting circuit for selecting an up-signal indicating a maximum phase difference among the N-pieces of up-signals;
  a minimum up-signal selecting circuit for selecting an up-signal indicating a minimum phase difference among N-pieces of up-signals;

a maximum down-signal selecting circuit for selecting a down-signal indicating a maximum phase difference among N-pieces of down-signals;

a minimum down-signal selecting circuit for selecting a down-signal indicating a minimum phase difference among N-pieces of down-signals;

a first charge pump for generating a current in accordance with the up-signal indicating the maximum phase difference and the down-signal indicating the maximum phase difference;

a second charge pump for generating a current in accordance with the up-signal indicating the minimum phase difference and the down-signal indicating the minimum phase difference;

an adder for adding the current generated by the first charge pump and the current generated by the second charge pump;

a loop filter for generating a control voltage in accordance with an added current by the adder; and a voltage control oscillator for generating the extracted clock signal of a frequency in accordance with the control voltage.

According to a fifth aspect of the present invention there is provided a clock signal extracting circuit extracting a clock signal from N-pieces of data bit signals, where the N is an integer of two or more, the clock signal extracting circuit including:

N-pieces of phase comparators, each of which compares a phase of each of the data bit signals with a phase of an extracted clock signal and generates an up-signal and a down-signal in accordance with a compared result;

a maximum up-signal selecting circuit for selecting an up-signal indicating a maximum phase difference among N-pieces of up-signals;

a minimum up-signal selecting circuit for selecting an up-signal indicating a minimum phase difference among the N-pieces of up-signals;

a first charge pump for generating a current in accordance with the up-signals indicating the maximum phase difference and one of N-pieces of the down-signals;

a second charge pump for generating a current in accordance with the up-signal indicating the minimum phase difference and one of N-pieces of the down-signals;

an adder for adding the current generated by the first charge pump and the current generated by the second charge pump;

a loop filter for generating a control voltage in accordance with an added current by the adder; and a voltage control oscillator for generating the extracted clock signal of a frequency in accordance with the control voltage.

According to a sixth aspect of the present invention there is provided a parallel digital interface including:

a clock signal extracting circuit including: N-pieces of phase comparators, where N is an integer of two or more, each of which compares a phase of each of the data bit signals with a phase of an extracted clock signal and generates a phase difference signal in accordance with a compared result; a circuit for averaging N-pieces of the phase difference signals and for generating a control voltage; and a voltage control oscillator for generating the extracted clock signal of a frequency in accordance with the control voltage; and N-pieces of flip-flop circuits, each of which synchronizes each of the data bit signals with the extracted signal.

According to a seventh aspect of the present invention there is provided a clock signal extracting method of extracting a clock signal from N-pieces of data bit signals, where the N is an integer of two or more, the clock signal extracting method including:

a step of comparing a phase of each of the data bit signals with a phase of an extracted clock signal and of generating N-pieces of phase difference signals in accordance with a compared result;

a step of averaging N-pieces of the phase difference signals and of generating a control voltage; and a step of generating the extracted clock signal of a frequency in accordance with the control voltage.

According to an eighth aspect of the present invention there is provided a clock signal extracting method of extracting a clock signal from N-pieces of data bit signals, where the N is an integer of two or more, the clock signal extracting method including:

a step of comparing a phase of each of the data bit signals with a phase of an extracted clock signal and of generating N-pieces of phase difference signals in accordance with a compared result;

a step for generating a control voltage based on a phase difference signal indicating a maximum phase difference and a phase difference signal indicating a minimum phase difference among the N-pieces of phase difference signals; and a step of generating the extracted clock signal of a frequency in accordance with the control voltage.

According to a ninth aspect of the present invention there is provided a synchronizing method for a parallel data bit signal including:

a step of comparing a phase of each of the data bit signals with a phase of an extracted clock signal and of generating N-pieces of phase difference signals in accordance with a compared result, where N is an integer of two or more;

a step of averaging N pieces of the phase difference signals and of generating a control voltage;

a step of generating the extracted clock signal of a frequency in accordance with the control voltage; and a step of synchronizing the N-pieces of data bit signals by the extracted signal.

According to a tenth aspect of the present invention there is provided a clock signal extracting method of extracting a clock signal from N-pieces of data bit signals, where the N is an integer of two or more, the clock signal extracting method including:

a step of comparing a phase of each of the data bit signals with a phase of an extracted clock signal and of generating N-pieces of phase difference signals in accordance with a compared result;

a step for generating a control voltage based on a phase difference signal indicating a maximum phase difference and a phase difference signal indicating a minimum phase difference among the N-pieces of phase difference signals; a step of generating the extracted clock signal of a frequency in accordance with the control voltage; and a step of synchronizing the N-pieces of data bit signals by the extracted signal.

With the above configurations, in the clock signal extracting circuit generating a clock signal used for retiming and synchronization of plural data bit signals, phase comparator and charge pump circuits are arranged for each data bit signal and outputs from the phase comparator and the charge pump circuits are added and averaged, therefore, a whole retiming margin of plural bits can be increased.

Also, an extracting clock signal is controlled so as to rise at a middle timing between a middle timing value between change timings which are adjacent to each other in a data bit signal of which a change timing is fastest and a middle timing value between change timings which are adjacent to each other in a data bit signal of which a change timing is slowest. Therefore, though there is a deviation of skew among data bit signals, the extracting clock signal does not be displaced. Therefore, in view of all data bit signals, though there is a deviation of skew among data bit signals, it is controlled so as to increase a retiming margin.

Furthermore, in the clock signal extracting circuit, the voltage control oscillator and the loop circuit occupying most of a circuit scale and a power consumption are used commonly, therefore, it is possible to prevent the circuit scale and the power consumption from increasing.

BRIEF DESCRIPTION OF THE DRAWINGS

The above and other objects, advantages and features of the present invention will be more apparent from the following description taken in conjunction with the accompanying drawings in which.

DETAILED DESCRIPTION OF THE PREFERRED EMBODIMENTS

Best modes of carrying out the present invention will be described in further detail using various embodiments with reference to the accompanying drawings.

First Embodiment

First, explanations will be given of a configuration of a parallel digital interface including a clock signal extracting circuit according to a first embodiment of the present invention.

Figure 1:
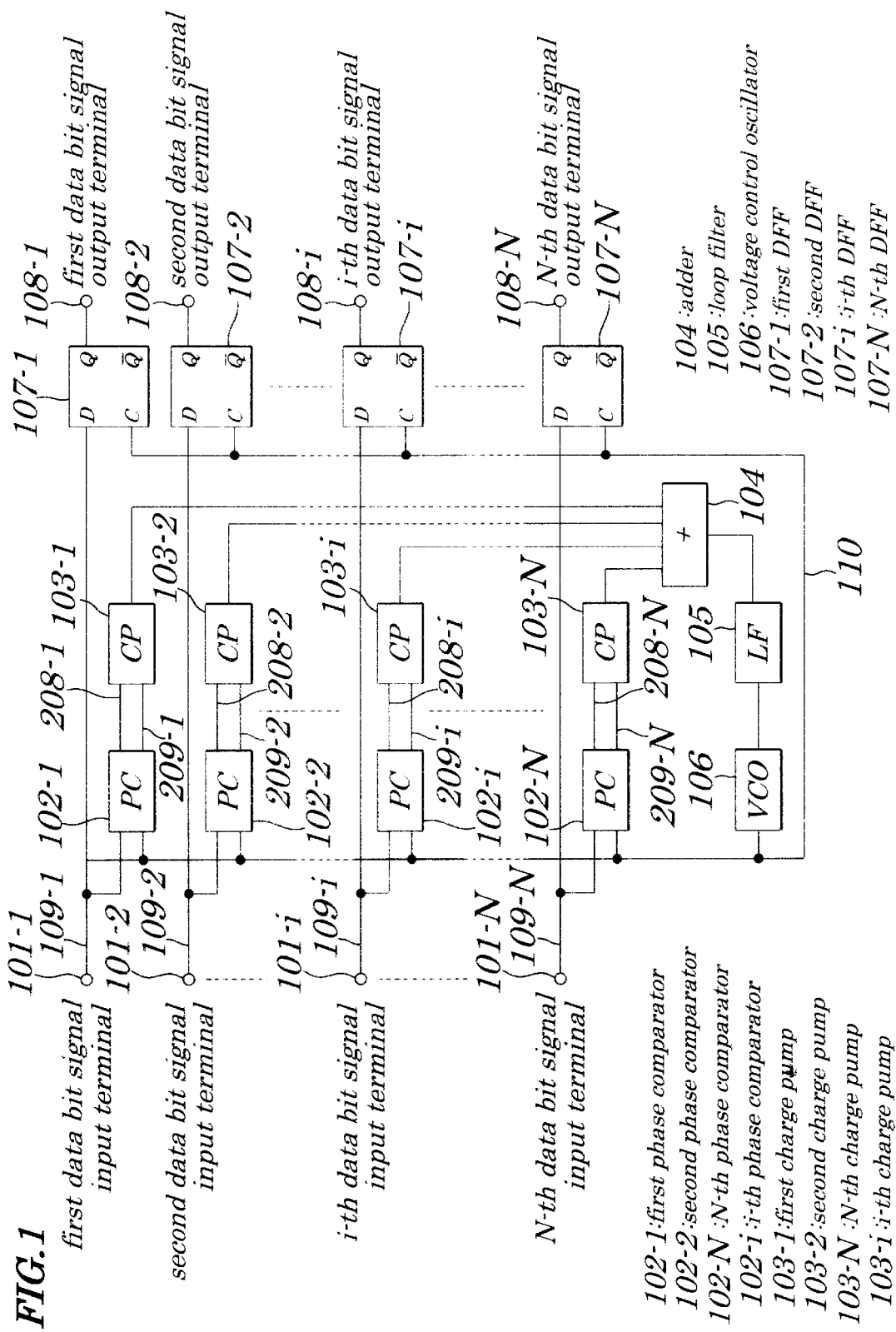
FIG. 1 is a block diagram showing a parallel digital interface including a clock signal extracting circuit according to a first embodiment of the present invention.

As shown in FIG. 1, the clock signal extracting circuit according to the first embodiment includes N-pieces (N is an integer of two or more) of phase comparators 102-1, 102-2 ... 102-N, N-pieces of charge pumps 103-1, 103-2 ... 103-N, an adder 104 for adding outputs from the N-pieces of charge pumps 103-1, 103-2 ... 103-N.

Each of the phase comparators 102-1, 102-2 ... 102-N outputs a signal in response to a phase difference between a first input signal and a second input signal. Each of the charge pumps 103-1, 103-2 ... 103-N receives a signal outputted from each of the phase comparators 102-1, 102-2 ... 102-N and inputs and outputs an electric current in response to phase difference.

An i-th ($1 \leq i \leq N$) data bit signal input terminal 101-$i$ is connected to a first input terminal of an i-th phase comparator 102-$i$ and is connected to an i-th D-type flip-flop circuit 107-$i$. An output terminal of i-th phase comparator 102-$i$ is connected to an input terminal of an i-th charge pump 103-$i$.

Output terminals of the first charge pump 103-1 through the N-th charge pump 103-N are connected to an input terminal of the adder 104. An output terminal of the adder 104 is connected to an input terminal of the loop filter 105. An output terminal of a loop filter 105 is connected to an input terminal of a voltage control oscillator 106.

An output terminal of the voltage control oscillator 106 is connected to second input terminals of the first phase comparator 102-1 through the N-th phase comparator and connected to clock signal terminals of a first D-type flip-flop circuit 107-1 through an N-th D-type flip-flop circuit 107-N.

An output terminal of an i-th ($1 \leq i \leq N$) D-type flip-flop circuit 107-$i$ is connected to an i-th data bit signal output 108-$i$.

Figure 2:
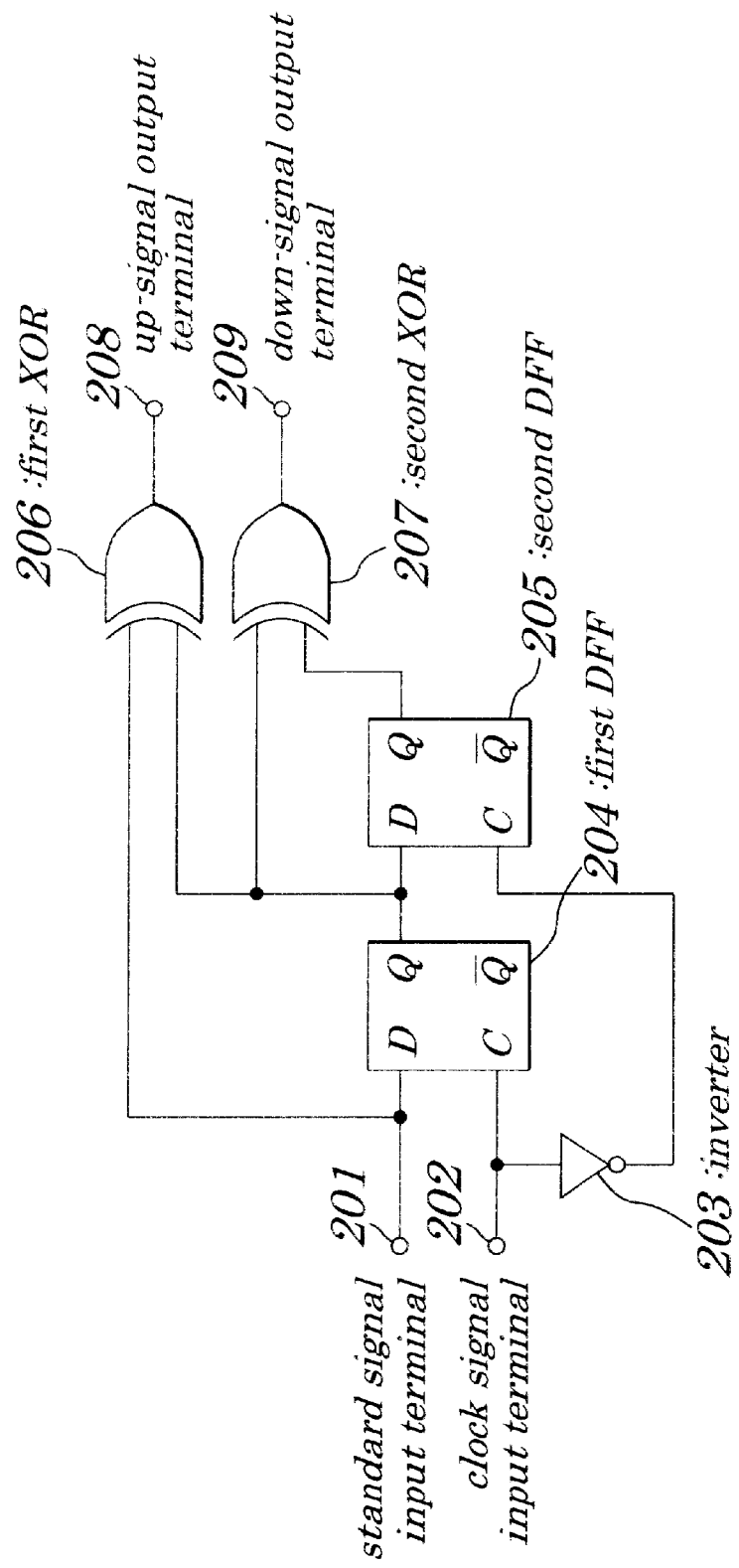
FIG. 2 is a block diagram showing a phase comparator shown in FIG. 1 according to the first embodiment of the present invention.

Next, explanations will be given of a configuration of the phase comparator 102-$i$ ($1 \leq i \leq N$) according to the first embodiment with reference to FIG. 2.

The phase comparator 102-$i$ ($1 \leq i \leq N$) according to the first embodiment includes a standard signal input terminal 201, a clock signal input terminal 202, a first D-type flip-flop circuit 204, a second D-type flip-flop circuit 205, a first exclusive (XOR) gate 206, a second exclusive (XOR) gate 207, an up-signal output terminal 208 and a down-signal output terminal 209.

The standard signal input terminal 201 is connected to a data input terminal of the first D-type flip-flop circuit 204 and connected to one input terminal of the first exclusive (XOR) gate 206. An output terminal of the D-type flip-flop circuit 204 is connected to another input terminal of the first exclusive (XOR) gate 206, connected to an input terminal of the second exclusive (XOR) gate 207 and connected to a data input terminal of the second D-type flip-flop circuit 205. An output terminal of the second D-type flip-flop circuit 205 is connected to another input terminal of the second exclusive (XOR) gate 207. An output terminal of the first exclusive (XOR) gate 206 is connected to the up-signal output terminal 208. An output terminal of the second exclusive (XOR) gate 207 is connected to the down-signal output terminal 209. The clock signal input terminal 202 is connected to a clock signal terminal of the first D-type flip-flop circuit 204 and connected to an input terminal of the inverter 203. An output terminal of an inverter 203 is connected to a clock signal terminal of the second D-type flip-flop circuit 205.

Next, explanations will be given of an operation of a phase comparator 102-$i$ ($1 \leq i \leq N$) according to the first embodiment with reference to FIG. 3. Incidentally, when values of input data bit signals to be inputted into the standard signal input terminal 201 are continuously similar, it is obvious that both up-signal and down-signal do not become active, therefore, an explanation is omitted of an operation in this case. Additionally, waveforms of the up-signal and the down-signal are LOW-level constant waveforms in this case.

Figure 3:
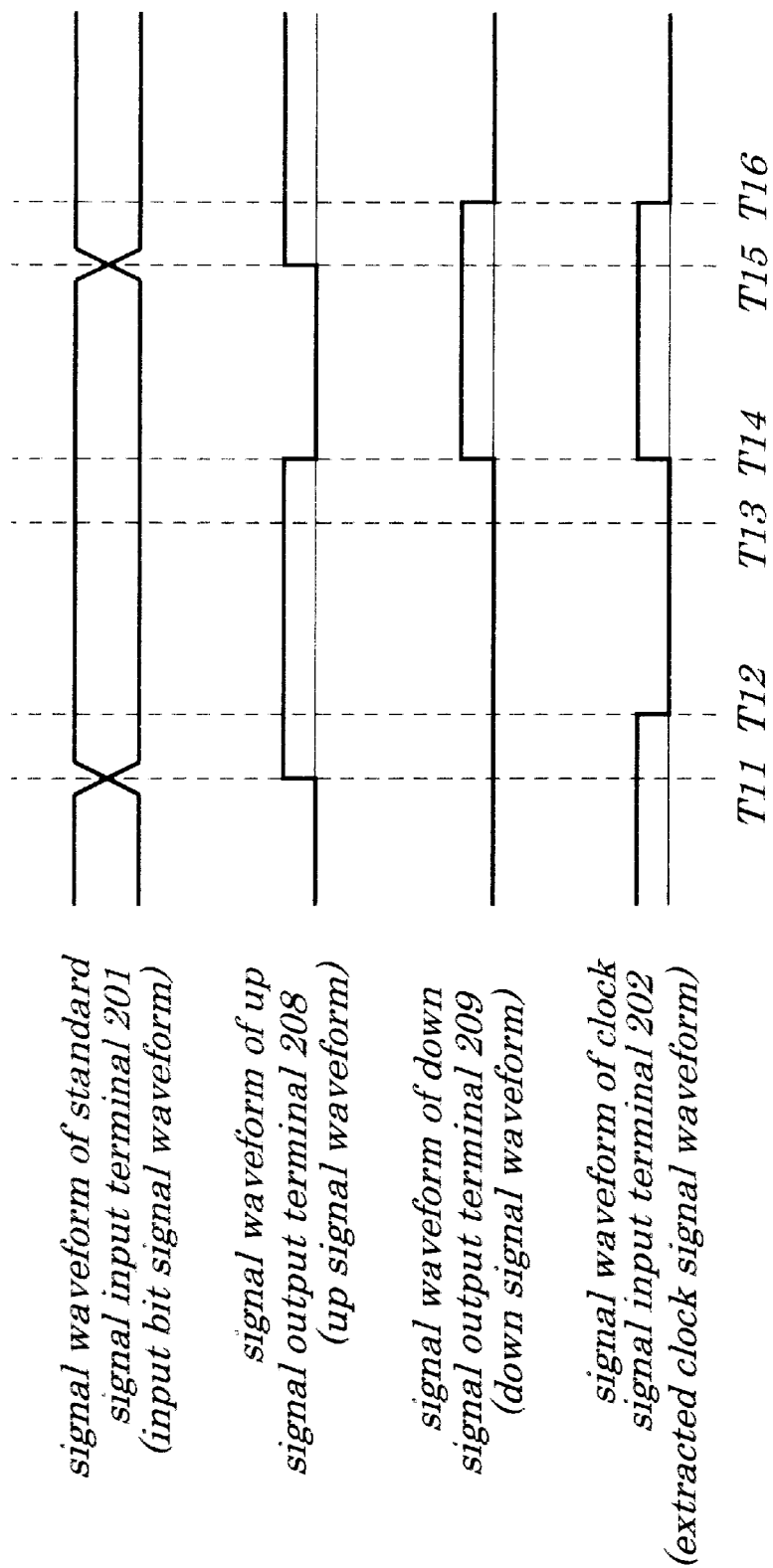
FIG. 3 is a timing chart showing signal waveforms of respective terminals in the phase comparator according to the first embodiment of the present invention.

As shown in FIG. 3, when an input data bit signal inputted into the standard signal input terminal 201 varies at a time T11, the up-signal outputted from the up-signal output terminal 208 rises. When an extracted clock signal inputted into the clock signal input terminal 202 rises at a time T14, the up-signal falls and the down-signal outputted from the down-signal output terminal 209 rises. As a result, in a period from a change time of the standard signal to a falling time of a next extracted clock signal, the up-signal becomes a HIGH-level. In a period in that the extracted clock signal is the HIGH level after varying the standard signal, the down-signal becomes a HIGH-level. When the up-signal and the down-signal are supplied to a charge pump in a normal clock signal extracting circuit including the phase comparator, the charge pump, the loop filter and the voltage control oscillator, the extracted clock signal is controlled in a manner that a rising time of the extracted clock signal is set to a time T13 which is a middle point of adjacent change points to the standard signal. When this control is applied, the up-signal and the down-signal of the phase comparator are similar concerning widths of the HIGH-level.

Next, explanations will be given of an operation of the clock signal extracting circuit of the first embodiment with reference to FIG. 1 and FIG. 4. Additionally, as an example, explanations will be given of a case in that a parallel number N of circuits is three, however, an operation principle in a case of any parallel number is similar to that in the case of three parallel circuits if only the parallel number is plural.

Figure 4:
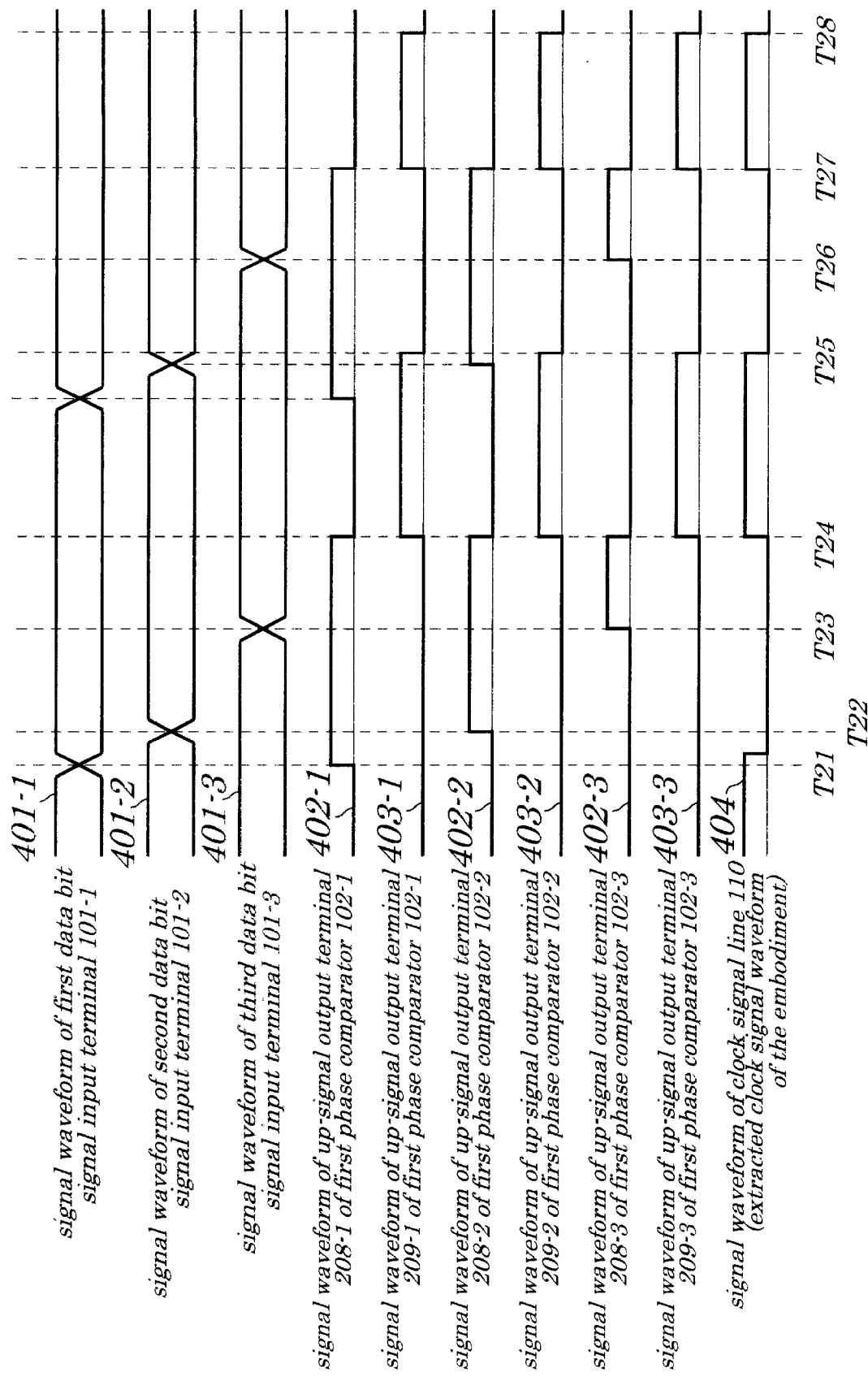
FIG. 4 is a timing chart showing signal waveforms of essential terminals in the phase comparator according to the first embodiment of the present invention.

FIG. 4 shows an example of a data bit signal 109-1 received by the first data bit signal input terminal 101-1, a data bit signal 109-2 received by the second data bit signal input terminal 101-2 and a data bit signal 109-3 received by the first data bit signal input terminal 101-3, including skews caused by reciprocal delay differences. Waveforms of the data bit signal 109-1, the data bit signal 109-2 and the data bit signal 109-3 are designated by a waveform 401-1, a waveform 401-2 and a waveform 401-3, respectively.

The first phase comparator 102-1 outputs the up-signal and the down-signal shown by the waveform 402-1 and the waveform 403-1. The second phase comparator 102-2 outputs the up-signal and the down-signal shown by the waveform 402-2 and the waveform 403-2. The third phase comparator 102-3 outputs the up-signal and the down-signal shown by the waveform 402-3 and the waveform 403-3. An up-signal 208-1 and a down-signal 209-1 are controlled so that a leading edge of the extracting clock signal outputted from the voltage control oscillator 106 to the clock signal line 110 comes to a middle point between adjacent change points of the first data bit signal 109-1. An up-signal 208-2 and a down-signal 209-2 are controlled so that a leading edge of the extracting clock signal outputted from the voltage control oscillator 106 to the clock signal line 110 comes to a middle point between adjacent change points of the second data bit signal 109-2. An up-signal 208-3 and a down-signal 209-3 are controlled so that a leading edge of the extracted clock signal outputted from the voltage control oscillator 106 to the clock signal line 110 comes to a middle point between adjacent change points of the third data bit signal 109-3.

Electric charges from the first charge pump 103-1, the second charge pump 103-2 and the third charge pump 103-3 in the loop filter 105 via the adder 104 in accordance with the up-signals and the down-signals inputted from the first phase comparator 102-1, the second phase comparator 102-2 and the third phase comparator 102-3 and electric charges discharging from the loop filter 105 are averaged, and an oscillating frequency of the voltage control oscillator 106 is controlled by an averaged control voltage in accordance with an averaged charge quantity.

Therefore, a middle point of the extracting clock signal outputted from the voltage control oscillator 106 to the extracting clock signal line 110, as shown by a waveform 404, is a middle point between adjacent change points of the data bit signal 109-1, a middle point between adjacent change points of the data bit signal 109-2 and a middle point between adjacent change points of the data bit signal 109-3. Though the waveform 404 is controlled so as to decrease a retiming margin for the data bit signal 109-3, the waveform 404 is controlled so as to increase a retiming margin for the data bit signal 109-1. Therefore, in view of all data bit signals, the waveform 404 is controlled so as to increase retiming margins.

Additionally, when values of input data bit signals inputted from the i-th data bit signal input terminal are continuously equal, both of an up-signal 208-$i$ and a down-signal outputted from the i-th phase comparator 102-$i$ do not become active and no influence is given to the loop filter 105. Only phase comparators and charge pumps of input data bit lines of which adjacent bits about time are different give influences to the loop filter 105.

Figure 5:
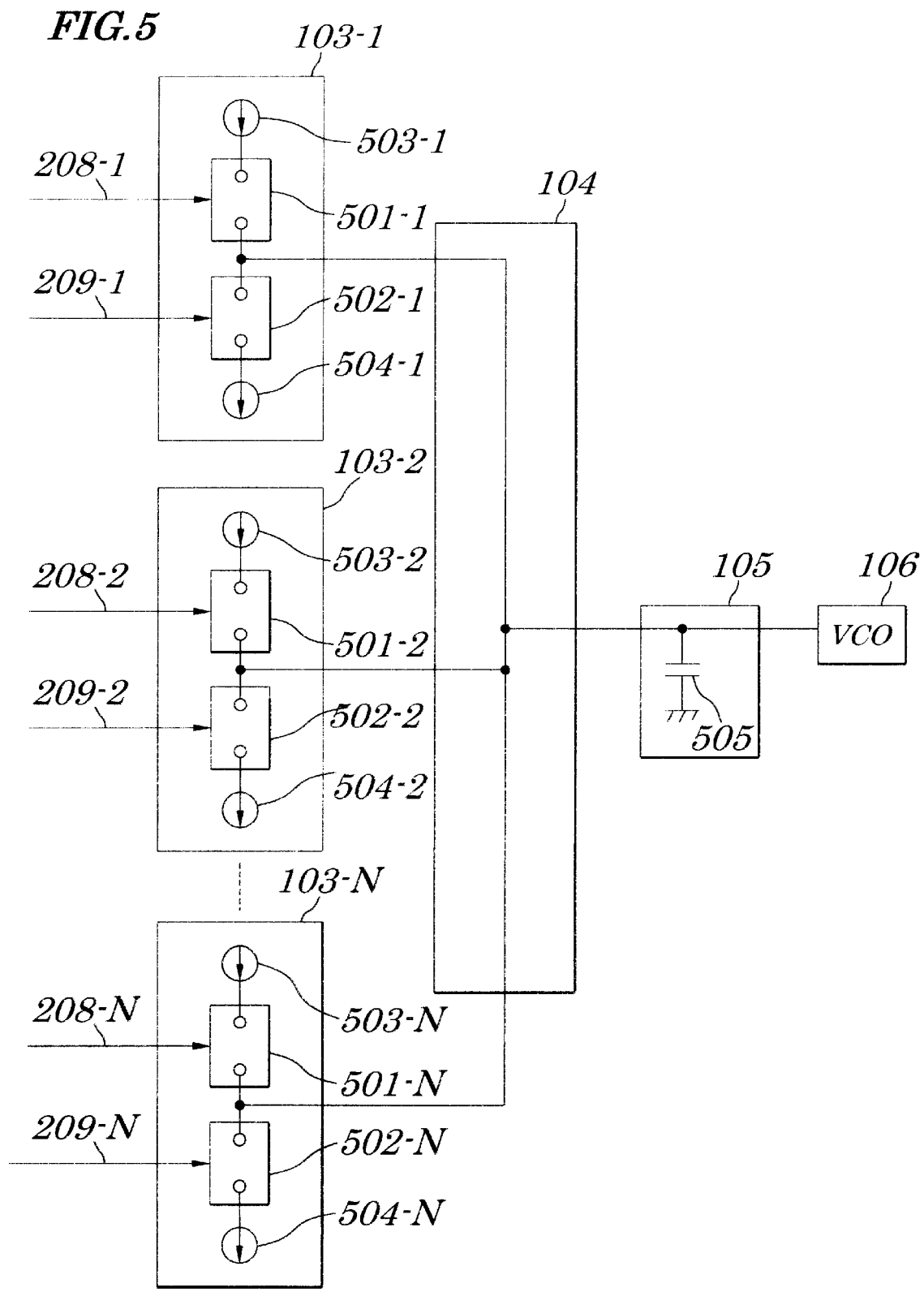
FIG. 5 is a circuit diagram showing a charge pump, an adder and a loop filter shown in FIG. 1.

Referring to FIG. 5, a charge pump 103-$i$ ($1 \leq i \leq N$) includes a current source 503-$i$, a switch 501-$i$ controlled by the up-signal 208-$i$, a switch 502-$i$ controlled by a down-signal 209-$i$ and a current source 504-$i$ which are connected in series. The adder 104 is made by a wired logic. The loop filter 105 includes a capacitor 505. The adder 104 may be configured using an operational amplifier. Also, the adder 104 and the loop filter 105 are integrated and made using an operational amplifier.

Second Embodiment

In the clock signal extracting circuit of the first embodiment, when there is imbalance of skews among data bit signals, a position of an extracted clock signal becomes imbalanced. For example, in FIG. 4, when a skew between the first data bit signal 109-1 and the second data bit signal 109-2 is 0 (zero) and these is a skew between these data bit signals and the third data bit signal 109-3, all phase differences among three data bit signals are added and averaged. Therefore, though retiming margins for the first data bit signal 109-1 and the second data bit signal 109-2 increase, a retiming margin for the third data bit signal 109-3 decreases.

A second embodiment solves above-mentioned problems.

Figure 6:
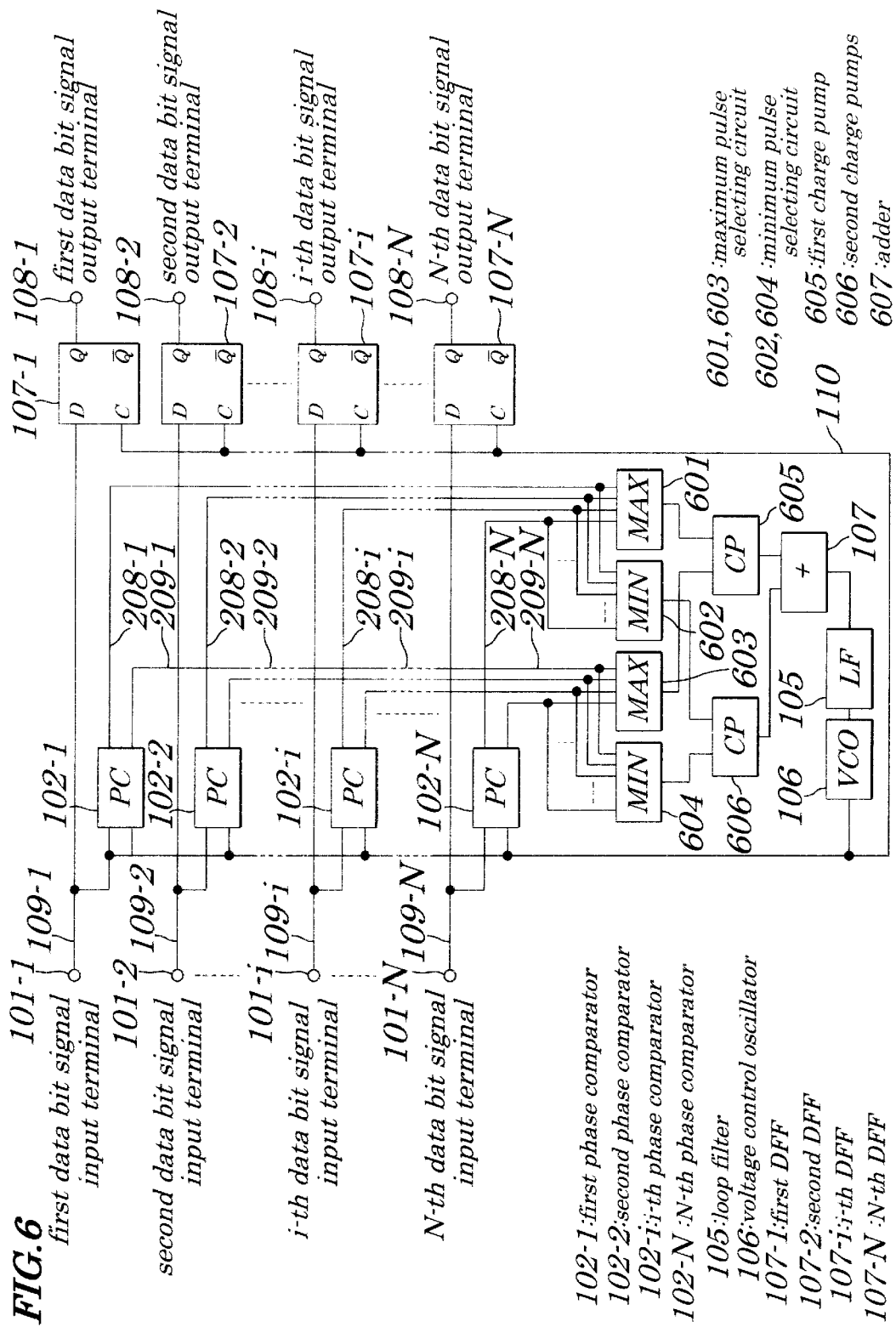
FIG. 6 is a block diagram showing a parallel digital interface including a clock signal extracting circuit according to a second embodiment of the present invention.

As shown in FIG. 6, differences between the first embodiment and the second embodiment are that the first charge pump 103-1 through the N-th charge pump 103-N and the adder 104 are omitted and a maximum pulse selecting circuit 601, a maximum pulse selecting circuit 603, a minimum pulse selecting circuit 602 and a minimum pulse selecting circuit 604 are added.

Figure 7:
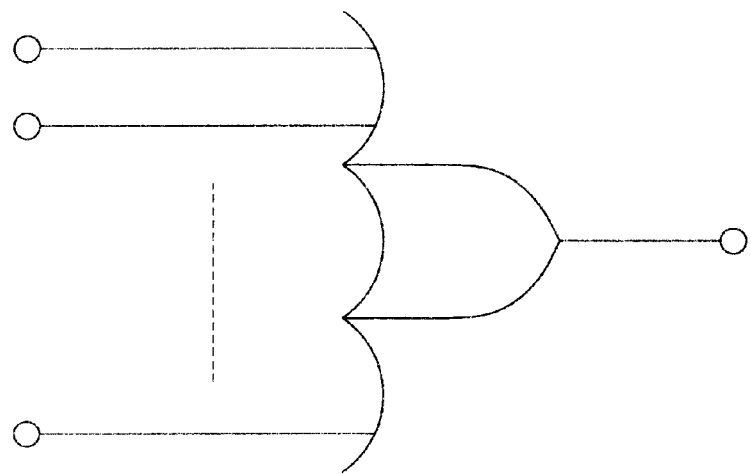
FIG. 7 is a circuit diagram showing a longest pulse selecting circuit according to the second embodiment of the present invention.
Figure 8:
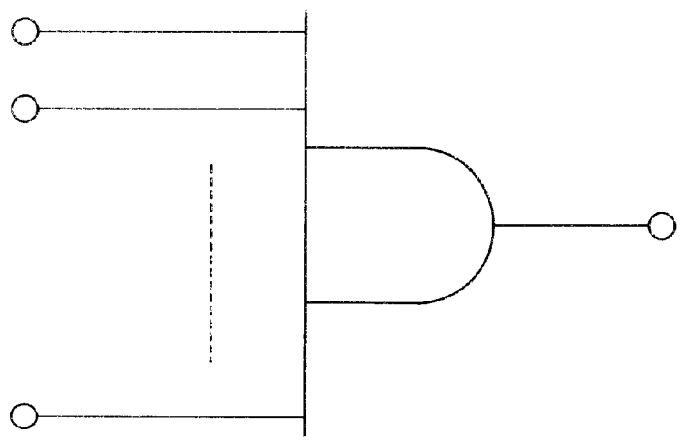
FIG. 8 is a circuit diagram showing a shortest pulse selecting circuit according to the second embodiment of the present invention.
Figure 9:
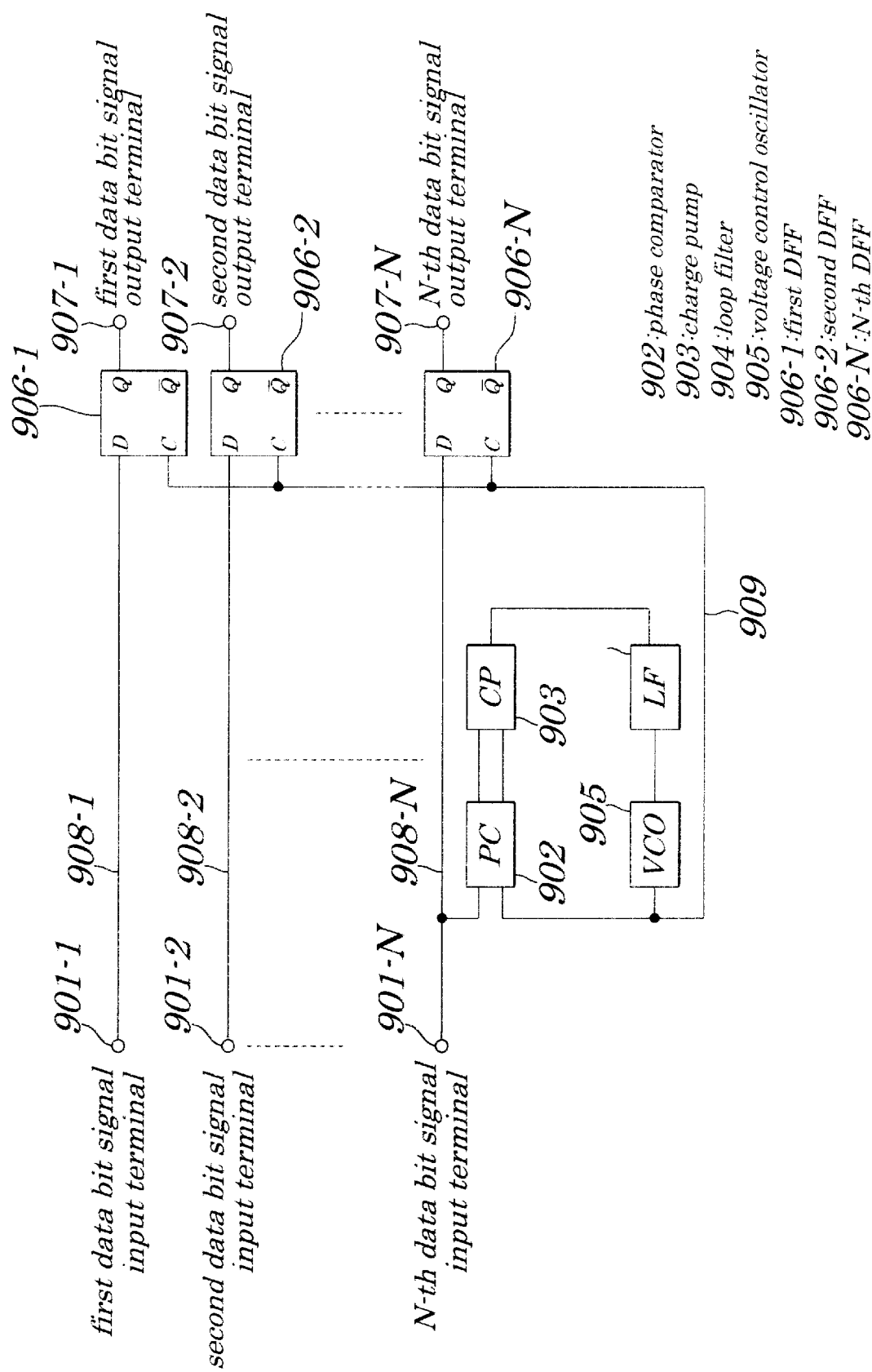
FIG. 9 is a block diagram showing a conventional parallel digital interface including a clock signal extracting circuit.
Figure 10:
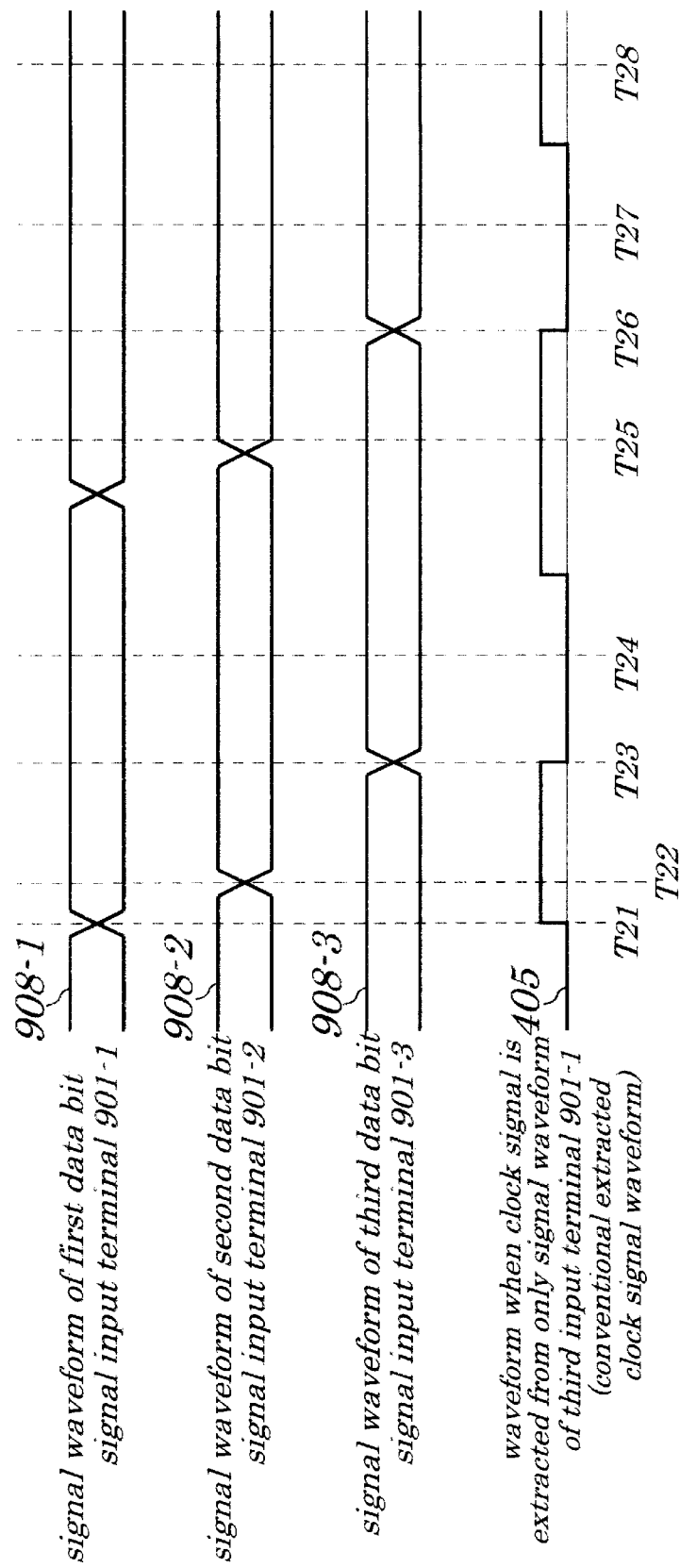
FIG. 10 is a timing chart showing conventional signal waveforms of essential terminals.

The maximum pulse selecting circuit 601 receives an up-signal 208-1, an up-signal 208-2 . . . an up-signal 208-N and outputs an up-signal having a longest pulse length. The minimum pulse selecting circuit 602 receives the up-signal 208-1, the up-signal 208-2 . . . the up-signal 208-N and outputs a up-signal having a shortest pulse length. Similarly, the maximum pulse selecting circuit 603 receives an up-signal 209-1, an up-signal 209-2 ... an up-signal 209-N and outputs an up-signal having a longest pulse length. The minimum pulse selecting circuit 604 receives the up-signal 209-1, the up-signal 209-2 ... the up-signal 209-N and outputs an up-signal having a shortest pulse length. The maximum pulse selecting circuit 601 and the maximum pulse selecting circuit 603, for example, are multiple input logical addition (OR) gates shown in FIG. 7. The minimum pulse selecting circuit 602 and the minimum pulse selecting circuit 604, for example, are multiple input logical multiplication (AND) gates shown in FIG. 8.

A first charge pump 605 receives a maximum up-signal outputted from the maximum pulse selecting circuit 601 and generates a current corresponding to these signals for charging or discharging a loop filter 105. Similarly, a second charge pump 606 receives a minimum down-signal outputted from the minimum pulse selecting circuit 604 and generates a current corresponding to these signals for charging or discharging the loop filter 105.

Configurations of the first charge pump 605, the second charge pump 606 and an adder 607 are similar to those shown in FIG. 5.

Additionally, since all pulse lengths of down-signals outputted from a first phase comparator 102-1 through an N-th phase comparator 102-N are similar, the maximum pulse selecting circuit 603 and the minimum pulse selecting circuit 604 may be removed and a down-signal **209-*i* outputted from a voluntarily selected phase comparator 102-*i* (1≦i≦N) may be directly supplied to the first charge pump 605 and the second charge pump 606**.

According to the second embodiment, the extracting clock signal is controlled so as to rise in a middle timing between a middle timing value between change timings adjacent to each other of a data bit signal having a fastest change timing and change timings adjacent each other of a data bit signal having the slowest change timing.

Therefore, though there is imbalance of skews among the data bit signals, a position of the extracting clock signal is not imbalanced.

For example, in FIG. 4, though a skew between the first data bit signal 109-1 and the second data bit signal 109-2 is 0 (zero) and there is a skew between these data bit signals and the third data bit signal 109-3, a phase is controlled based on the first data bit signal 109-1 or the second data bit signal 109-2 and the third data bit signal 109-3. Therefore, in view of all data bit signals, though there is imbalance of the skews between the data bit signals, it is controlled to increase a retiming margin.

Additionally, when all data bit signals do not change, the maximum pulse selecting circuit 601, the maximum pulse selecting circuit 603, the minimum pulse selecting circuit 602 and the minimum pulse selecting circuit 604 output no pulse, and in this case, control is not executed. A probability in which the minimum pulse selecting circuit 602 and the minimum pulse selecting circuit 604 output no pulse is higher than a probability in which the maximum pulse selecting circuit 601 and the maximum pulse selecting circuit 603 output no pulse, therefore, though rising timing of the extracting clock signal moves in a direction of a case in that control is executed using only the longest pulse in comparison with a case in that these circuits outputs no pulse, there is no practical problem. Also, when a number of data bits is large, there is little this inclination.

It is apparent that the present invention is not limited to the above embodiments but may be changed and modified without departing from the scope and spirit of the invention.

Finally, the present application claims the priority of Japanese Patent Application No. Heill-292702 filed on Oct. 14, 1999, which is herein incorporated by reference.

What is claimed is:

1. A clock signal extracting circuit extracting a clock signal from N-pieces of data bit signals, where said N is an integer of two or more, said clock signal extracting circuit comprising:

N-pieces of phase comparators, each of which compares a phase of each of said data bit signals with a phase of an extracted clock signal and generates an up-signals and a down-signals in accordance with a compared result;

a maximum up-signal selecting circuit for selecting an up-signal indicating a maximum phase difference among said signals;

a minimum up signal selecting circuit for selecting an up-signal indicating a minimum phase difference among said signals;

a maximum down-signal selecting circuit for selecting a down-signal indicating a maximum phase difference among said signals;

a minimum down-signal selecting circuit for selecting a down-signal indicating a minimum phase difference among said down-signals;

a first charge pump for generating a current in accordance with said up-signal indicating said maximum phase difference and said down-signal indicating said maximum phase difference;

a second charge pump for generating a current in accordance with said up-signal indicating said minimum phase difference and said down-signal indicating said minimum phase difference;

an adder for adding said current generated by said first charge pump and said current generated by said second charge pump;

a loop filter for generating a control voltage in accordance with an added current by said adder; and a voltage control oscillator for generating said extracted clock signal of a frequency in accordance with said control voltage.

2. A clock signal extracting circuit extracting a clock signal from N-pieces of data bit signals, where said N is an integer of two or more, said clock signal extracting circuit comprising:

N-pieces of phase comparators, each of which compares a phase of each of said data bit signals with a phase of an extracted clock signal and generates an up-signal and down-signal in accordance with a compared result;

a maximum up-signal selecting circuit for selecting an up-signal indicating a maximum phase difference among said up-signals;

a minimum up-signal selecting circuit for selecting an up-signal indicating a minimum phase difference among said up-signals;

a first charge pump for generating a current in accordance with said up-signal indicating said maximum phase difference and one of N-pieces of said down-signals;

a second charge pump for generating a current in accordance with said up-signal indicating said minimum phase difference and one of N-pieces of said down-signals;

an adder for adding said current generated by said first charge pump and said current generated by said second charge pump;

a loop filter for generating a control voltage in accordance with an added current by said adder; and a voltage control oscillator for generating said extracted clock signal of a frequency in accordance with said control voltage.

3. A parallel digital interface comprising:

a clock signal extracting circuit extracting a clock signal from N-pieces of data bit signals, where said N is an integer of two or more, said clock signal extracting circuit including: N-pieces of phase comparators, each of which compares a phase of each of said data bit signals with a phase of an extracted clock signal and generates an up-signals and a down-signals in accordance with a compared result; a maximum up-signal selecting circuit for selecting an up-signal indicating a maximum phase difference among said up-signals; a minimum up-signal selecting circuit for selecting an up-signal indicating a minimum phase difference among said up-signals; a maximum down-signal selecting circuit for selecting a down-signal indicating a maximum phase difference among said down-signals; a minimum down-signal selecting circuit for selecting a down-signal indicating a minimum phase difference among said down-signals; a first charge pump for generating a current in accordance with said up-signal indicating said maximum phase difference and said down-signal indicating said maximum phase difference; a second charge pump for generating a current in accordance with said up-signal indicating said minimum phase difference and said down-signal indicating said minimum phase difference; an adder for adding said current generated by said first charge pump and said current generated by said second charge pump; a loop filter for generating a control voltage in accordance with an added current by said adder; and a voltage control oscillator for generating said extracted clock signal of a frequency in accordance with said control voltage; and N-pieces of flip-flop circuits, each of which synchronizes each of said data bit signals with said extracted signal.

4. A parallel digital interface comprising:

a clock signal extracting circuit extracting a clock signal from N-pieces of data bit signals, where said N is an integer of two or more, said clock signal extracting circuit including: N-pieces of phase comparators, each of which compares a phase of each of said data bit signals with a phase of an extracted clock signal and generates up-signals and down-signals in accordance with a compared result; a maximum up-signal selecting circuit for selecting an up-signal indicating a maximum phase difference among said up-signals; a minimum up signal selecting circuit for selecting an up-signal indicating minimum phase difference among said up-signals; a first charge pump for generating a current in accordance with said up-signals indicating said maximum phase difference and one of N-pieces of said down-signals; a second charge pump for generating a current in accordance with said up-signal indicating said minimum phase difference and one of N-pieces of said down-signals; an adder for adding said current generated by said first charge pump and said current generated by said second charge pump; a loop filter for generating a control voltage in accordance with an added current by said adder; and a voltage control oscillator for generating said extracted clock signal of a frequency in accordance with said control voltage; and N-pieces of flip-flop circuits, each of which synchronizes each of said data bit signals with said extracted signal.

5. A clock signal extracting method of extracting a clock signal from N-pieces of data bit signals, where said N is an integer of two or more, said clock signal extracting method comprising:

comparing a phase of each of said data bit signals with a phase of an extracted clock signal and generating up-signals and down-signals in accordance with a compared result;

selecting an up-signal indicating a maximum phase difference among said up-signals;

selecting an up-signal indicating a minimum phase difference among said up-signals;

selecting a down-signal indicating a maximum phase difference among said down-signals;

selecting a down-signal indicating a minimum phase difference among of down-signals;

generating a first current in accordance with said up-signal indicating said maximum phase difference and said down-signal indicating said maximum phase difference;

generating a second current in accordance with said up-signal indicating said minimum phase difference and said down-signal indicating said minimum phase difference;

adding said first current and said second current;

generating a control voltage in accordance with said added current; and generating said extracted clock signal of a frequency in accordance with said control voltage.

6. The clock signal extracting method of claim 5, further comprising:

synchronizing each of said data bit signals with said extracted signal.

7. A clock signal extracting method of extracting a clock signal from N-pieces of data bit signals, where said N is an integer of two or more, said clock signal extracting method comprising:

comparing a phase of each of said data bit signals with a phase of an extracted clock signal and generating up-signals and down-signals in accordance with a compared result;

selecting an up-signal indicating a maximum phase difference among N-pieces of up-signals;

selecting an up-signal indicating a minimum phase difference among said up signals;

generating a first current in accordance with said up-signals indicating said maximum phase difference and one of said down-signals;

generating a second current in accordance with said up-signal indicating said minimum phase difference and one of N-pieces of said down-signals;

adding said first current and said second current;

generating a control voltage in accordance with said added current; and generating said extracted clock signal of a frequency in accordance with said control voltage.

8. The clock signal extracting method of claim 7, further comprising:

synchronizing each of said data bit signals with said extracted signal.

* * * * *